(12) United States Patent
Zhao et al.

(10) Patent No.: US 8,822,820 B2
(45) Date of Patent: Sep. 2, 2014

(54) FIXING MECHANISM AND ELECTRONIC DEVICE USING THE SAME

(75) Inventors: Bao-Gang Zhao, Shenzhen (CN); Yuan-Ming Wang, Shenzhen (CN); Xue-Feng Wan, Shenzhen (CN); Ping Li, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 202 days.

(21) Appl. No.: 13/532,856

(22) Filed: Jun. 26, 2012

(65) Prior Publication Data

US 2013/0081846 A1  Apr. 4, 2013

(30) Foreign Application Priority Data

Sep. 29, 2011 (CN) .......................... 2011 2 0368434

(51) Int. Cl.
*H05K 5/02* (2006.01)
(52) U.S. Cl.
USPC .......................................................... 174/50
(58) Field of Classification Search
CPC ....................................................... H05K 5/20
USPC .................. 174/50, 17 R, 58, 60, 63, 64, 559
See application file for complete search history.

*Primary Examiner* — Timothy Thompson
*Assistant Examiner* — Charles Pizzuto
(74) *Attorney, Agent, or Firm* — Novak Druce Connolly Bove + Quigg LLP

(57) ABSTRACT

A housing of an electronic device includes a lower cover, a back panel secured to the lower cover, and a fixing mechanism for fixing the back panel to the lower cover. The fixing mechanism includes a fixing portion defining a latching hole, an inserting portion, a restricting portion, and an engaging portion defining a slot. The fixing portion and the inserting portion position on the back panel. The restricting portion and the engaging portion protrude from the lower cover. The inserting portion is capable of inserting into the slot, and the restricting portion is capable of locking in the latching hole, for cooperatively fixing the back panel to the lower cover.

20 Claims, 4 Drawing Sheets

FIXING MECHANISM AND ELECTRONIC DEVICE USING THE SAME

BACKGROUND

1. Technical Field

The present disclosure relates to electronic devices; and particularly, to an electronic device having a housing for mounting a connector.

2. Description of Related Art

Housings of electronic devices, such as DVD players, include a lower cover, a front panel and a back panel arranged on opposite ends of the lower cover, and an upper cover. The upper cover, the lower cover, the front panel and the back panel are successively connected to form a closing space to protect components of the electronic device. The back panel is typically assembled and fixed to the lower cover by mean of screws, and auxiliary tools are required for disassembly and assembly of the back panel, thereby causing inconvenience and constraint on operation.

Therefore, there is room for improvement in the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
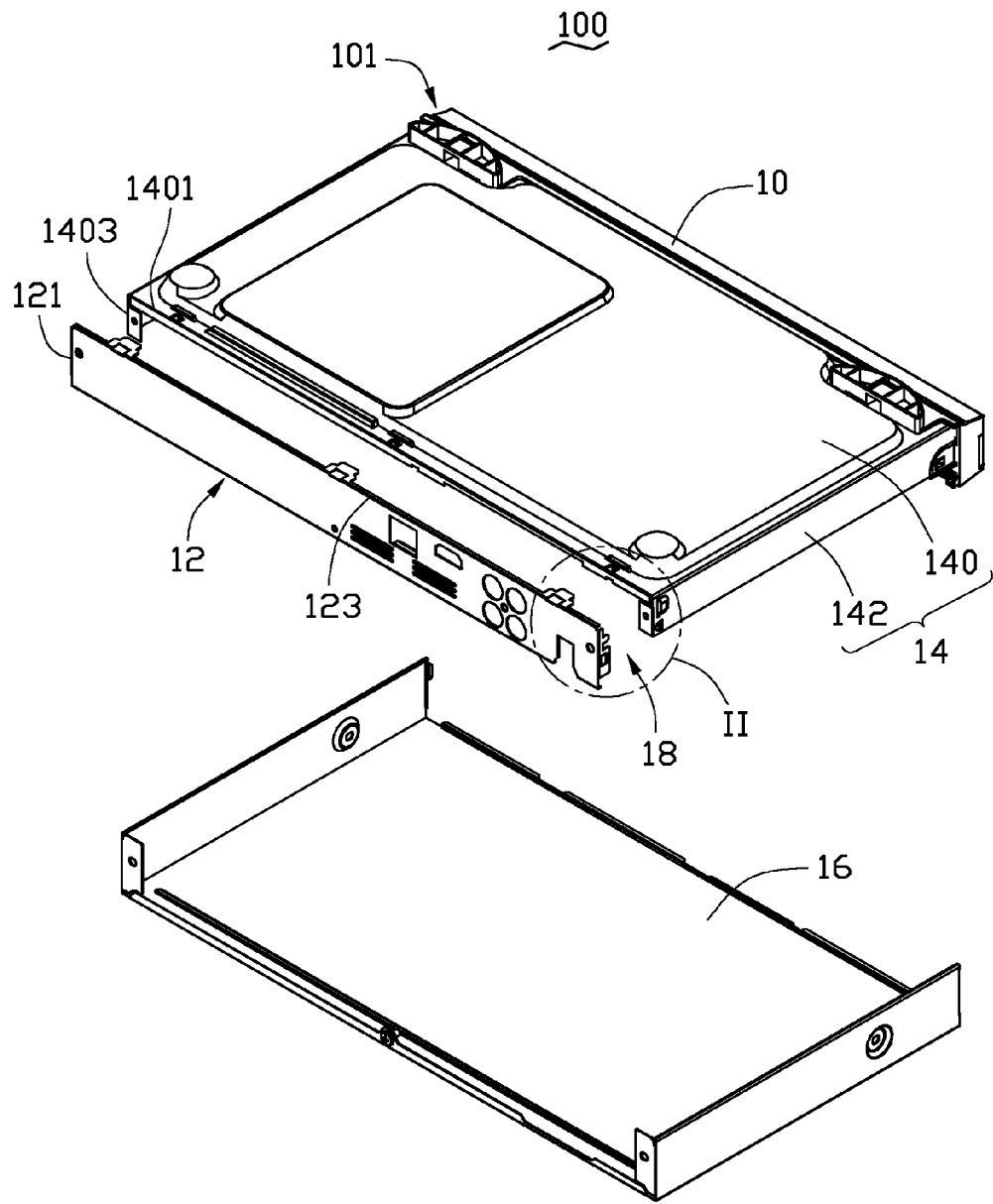
FIG. 1 is a partially disassembly view of an embodiment of an electronic device.

Referring to FIG. 1, an electronic device 100 includes a housing 101 and a plurality of components (not shown) received in the housing 101. The housing 101 includes a front panel 10, a back panel 12, a lower cover 14, an upper cover 16, and a fixing mechanism 18. The front panel 10 and the back panel 12 are secured to opposite sides of the lower cover 14. The upper cover 16 covers on the lower cover 14 and cooperates with the front panel 10 and the back panel 12 to form a closed space (not labeled) for receiving components of the electronic device 100. The fixing mechanism 18 is used to fix the back panel 12 to the lower cover 14. In the illustrate embodiment, the electronic device 100 is a DVD player.

The front panel 10 includes a plurality of keys (not shown) for receiving users' operations. The back panel 12 is substantially rectangular, and is parallel to the front panel 10. The back panel 12 includes opposite first rims 121 and a second rim 123. The second rim 123 extends lengthwise along the back panel 12. The first rims 121 are perpendicularly connected to opposite ends of the second rim 123.

Figure 2:
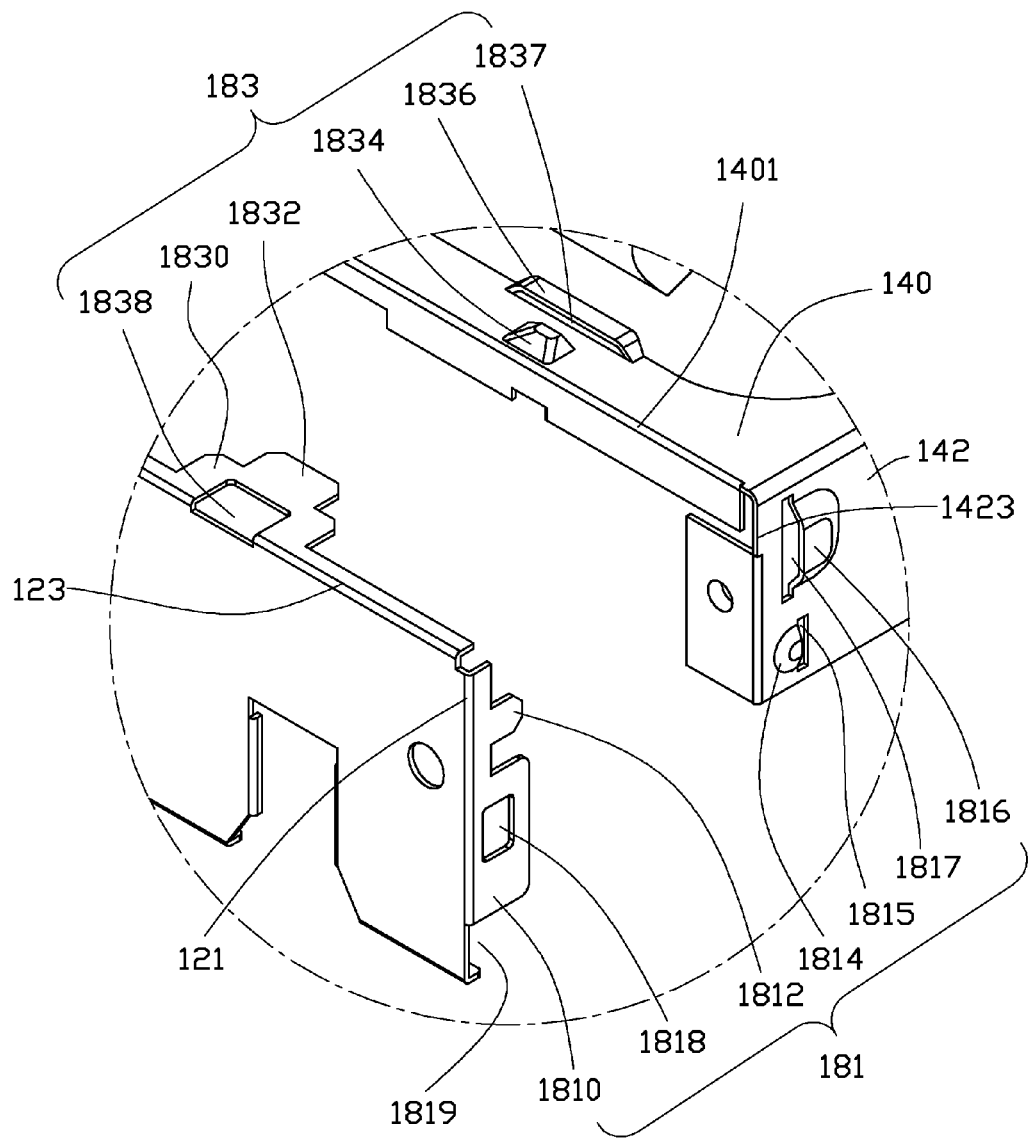
FIG. 2 is an enlarged view of label II of the electronic device of FIG. 1.

Referring to FIG. 2, the lower cover 14 includes a bottom plate 140 facing the upper cover 16, and opposite sidewalls 142. The bottom plate 140 includes a third rim 1401 corresponding to and parallel to the second rim 123. The third rim 1401 interconnects ends of the sidewalls 142. The sidewalls 142 perpendicularly extend from opposite edges of the bottom plate 140 and are perpendicular to the back panel 12. Each sidewall 142 includes a forth rim 1423 perpendicularly connecting with the third rim 1401. The forth rim 1423 corresponds to the first rim 121.

The fixing mechanism 18 includes two first fixing mechanisms 181 and three second fixing mechanisms 183. In the illustrate embodiment, the first fixing mechanisms 181 are position on opposite sides (for example, left and right sides) of the electronic device 100. The second fixing mechanisms 183 are arranged at the bottom of the electronic device 100 and are evenly spaced from each other. The second fixing mechanisms 183 are aligned in a line parallel to the second rim 123.

Each first structure 181 includes a first fixing portion 1810, a first inserting portion 1812, a first restricting portion 1814, and a first engaging portion 1816. The first fixing portion 1810 and the first inserting portion 1812 are positioned on the first rim 121 and are spaced from each other. The first restricting portion 1814 and the first engaging portion 1816 are positioned on the sidewall 142 and correspond to the first fixing portion 1810 and the first inserting portion 1812 respectively.

The first fixing portion 1810 is made of elastic material and perpendicularly extends from the first rim 121 toward the sidewall 142. The first fixing portion 1810 defines a first latching hole 1818. A predetermined gap 1819 is form between the first fixing portion 1810 and an end of the first rim 121 away from the second rim 123, for allowing a user to disassemble the back panel 12 conveniently. The first inserting portion 1812 is a substantially narrow strip-shaped, and perpendicularly extends from the first rim 121 toward the sidewall 142. The first inserting portion 1812 is coplanar with the first fixing portion 1810 in the embodiment.

The first restricting portion 1814 protrudes from the sidewall 142 and corresponds to the first latching hole 1818. The size of the first restricting portion 1814 is slightly smaller than the size of the first latching hole 1818 for allowing the first restricting portion 1814 to be received in the first latching hole 1818. An end of the first restricting portion 1814 away from the forth rim 1423 is cut to form a cutout 1815. The cutout 1815 abuts an edge of the first latching hole 1818 to prevent the first fixing portion 1810 from disengaging with the first restricting portion 1814 when the first restricting portion 1814 is received in the first latching hole 1818.

The first engaging portion 1816 protrudes from the sidewall 142 and defines a first slot 1817 for receiving the first inserting portion 1812. The first slot 1817 has substantially the same size as those of the first inserting portion 1812, for allowing insertion of the first inserting portion 1812. In the embodiment, when viewed from the inner surface of the sidewall 142, the first restricting portion 1814 and the first engaging portion 1816 are recessed in the inner surface of the sidewall 142; when viewed from the outer surface of the sidewall 142, the first restricting portion 1814 and the first engaging portion 1816 protrudes from the outer surface of the sidewall 142.

Each second fixing mechanism 183 includes a second fixing portion 1830, a second inserting portion 1832 connected to the second fixing portion 1830, a second restricting portion 1834, and a second engaging portion 1836. The second fixing portion 1830 is substantially plate-shaped and perpendicularly extends from the second rim 123 toward the bottom plate 140. The second fixing portion 1830 defines a second latching hole 1838. The second inserting portion 1832 is integrally formed with the second fixing portion 1830 and further extends from an end of the second fixing portion 1830 opposite to the second rim 123. The width of the second inserting portion 1832 is less than the width of the second fixing portion 1830 in the embodiment.

The second restricting portion 1834 protrudes from the bottom plate 140 and corresponds to the second latching hole 1838. The second restricting portion 1834 has slightly the smaller size than that of the second latching hole 1838 for allowing the second restricting portion 1834 to be received in the second latching hole 1838.

The second engaging portion 1836 protrudes from the bottom plate 140 and is parallel to the third rim 1401. The second engaging portion 1836 defines a second slot 1837 on an end surface facing the second restricting portion 1834. The second slot 1837 extends in a direction parallel to the second rim 123 and has substantially the same size as that of the second inserting portion 1832, for allowing insertion of the second inserting portion 1832. In the embodiment, when viewed from the inner surface of the bottom plate 140, the second restricting portion 1834 and the second engaging portion 1836 are recessed in the inner surface of the bottom plate 140; when viewed from the outer surface of the bottom plate 140, the second restricting portion 1834 and the second engaging portion 1836 protrude from the outer surface of the bottom plate 140.

Figure 3:
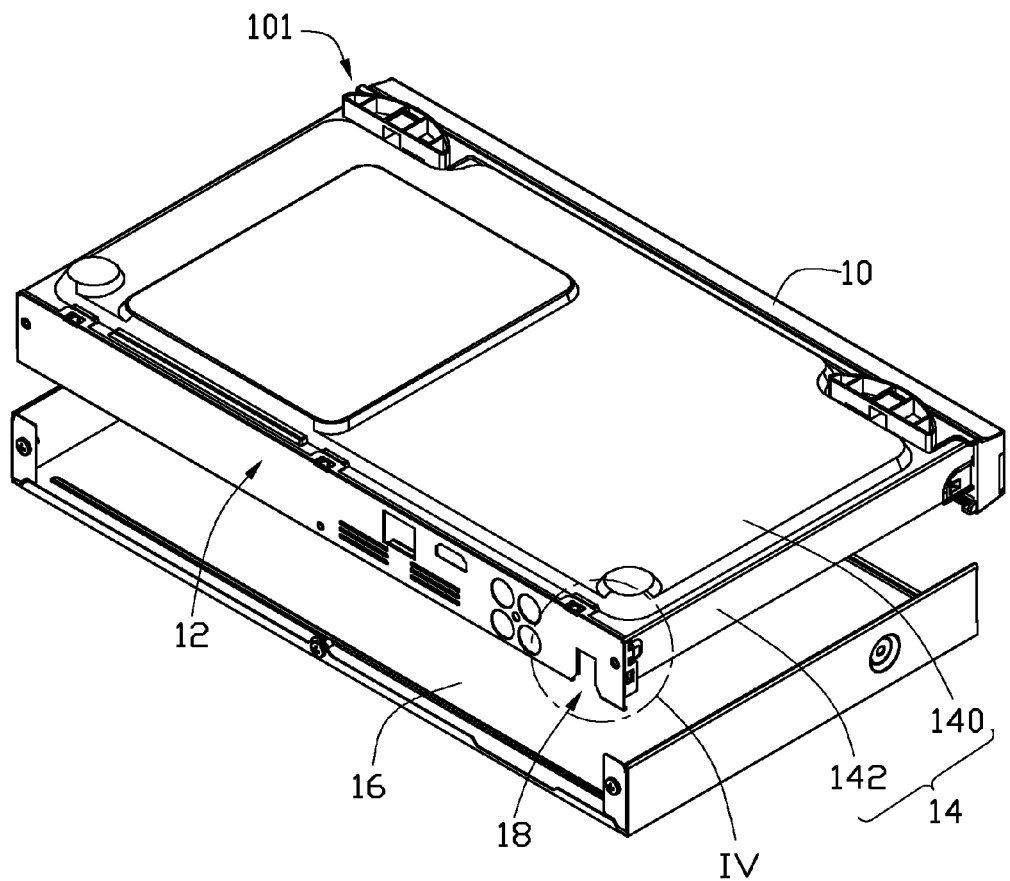
FIG. 3 is a partially assembled view of the electronic device of FIG. 1.
Figure 4:
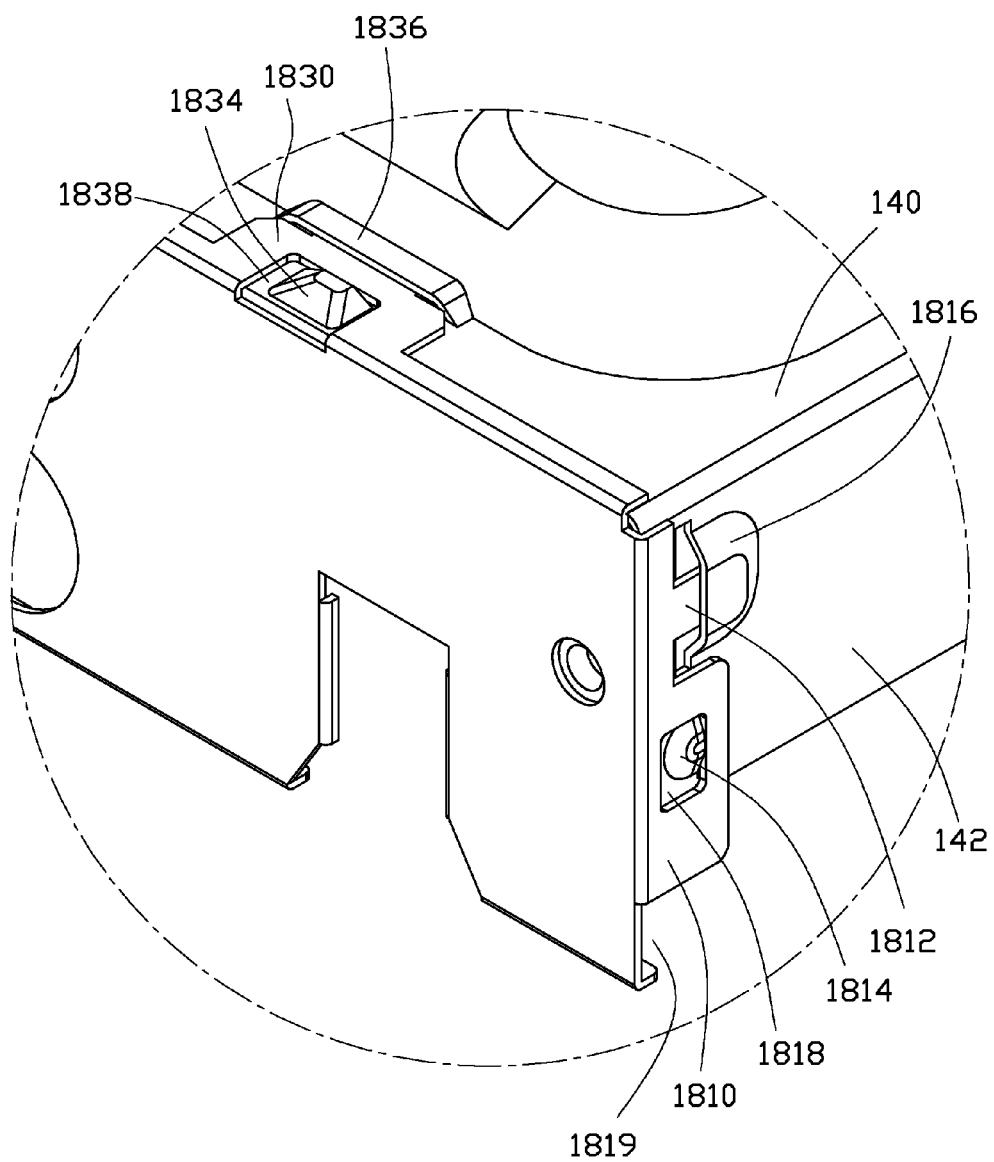
FIG. 4 is an enlarged view of label IV of the electronic device of FIG. 3.

Referring to FIGS. 3 and 4, to secure the back panel 12 to the bottom plate 140, firstly, the second inserting portions 1832 are slantingly inserted into the corresponding second slot 1837. Secondly, the back panel 12 is pressed down, the second restricting portions 1834 are received in the corresponding second latching hole 1838, the first inserting portions 1812 are inserted into the corresponding first slot 1817, and the first fixing portions 1810 elastically deform for allowing the first restricting portions 1814 to be received in and latched to the corresponding first latching hole 1818.

When assembled, the second inserting portions 1832 are limited in the corresponding second engaging portion 1836, and the second restricting portions 1834 are received in the corresponding second latching hole 1838, thus, the back panel 12 is prevented from being disengaging with the lower cover 14 in a direction perpendicular to the bottom plate 140. Furthermore, the first restricting portions 1814 are latched to the corresponding first latching hole 1818 for preventing the back panel 12 from being disengaged with the lower cover 14 in a direction parallel to the sidewalls 142, and the first inserting portions 1812 are limited in the corresponding first engaging portion 1816 for preventing the back panel 12 from disengaging with the lower cover 14 in a direction perpendicular to the sidewalls 142. As a result, the back panel 12 is steadily secured to the lower cover 14 and is prevented from disengaging with the lower cover 14.

In disassembly, the first fixing structure 1810 are elastically deformed to allow the first engaging portion 1814 disengaging with the first latching hole 1818; then, the back panel 12 is rotated such that the second inserting portions 1832 are capable of being slantingly disengaged with the corresponding second slot 1837, at the same time, the second restricting portions 1834 disengage with the corresponding second latching hole 1838, and the first inserting portions 1812 depart from the corresponding first slot 1817. As a result, the back panel 12 is disassembled from the lower cover 14 without using an auxiliary tool.

The fixing mechanism 18 is capable of fixing the back panel 12 to the lower cover 14 in three-dimensional directions, and allows disassembly and assembly of the back panel 12 to/from the lower cover 14 without any tool, such that the assembly and disassembly process can be quickly and conveniently implemented. It is noteworthy that the position of the first fixing mechanism 181 and the second fixing mechanism 183 can be exchanged according to need, and the number and the position of the fixing mechanism 18 may be changed according to need.

Although information and the advantages of the present embodiments have been set forth in the foregoing description, together with details of the structures and functions of the present embodiments, the disclosure is illustrative only; changes may be made in detail, especially in the matters of shape, size, and arrangement of parts within the principles of the present embodiments to the full extent indicated by the broad general meaning of the terms in which the appended claims are expressed.

What is claimed is:

1. A housing of an electronic device comprising:
   a lower cover comprising two sidewalls opposite to each other;
   a back panel secured to the lower cover; and
   two first fixing mechanisms respectively arranged at the two sidewalls for securing the back panel to the lower cover, each first fixing mechanism comprising:
   a first fixing portion positioned on the back panel and defining a first latching hole;
   a first inserting portion positioned on the back panel;
   a first restricting portion protruding from the lower cover; and
   a first engaging portion protruding from the lower cover and defining a first slot;
   wherein each first inserting portion is capable of being limited to each first slot for preventing the back panel from disengaging with the lower cover in a first direction, and each first fixing portion is capable of being latched to each first engaging portion for preventing the back panel from disengaging with the lower cover in a second direction perpendicular to the first direction.

2. The housing as claimed in claim 1, wherein the lower cover comprises a bottom plate, two sidewalls extending from opposite edges of the bottom plate, the back panel comprises opposite first rims corresponding to the sidewalls and a second rim corresponding to the bottom plate.

3. The housing as claimed in claim 2, wherein each first fixing portion extends from each first rim, each first restricting portion protrudes from each sidewall and corresponds to each first fixing portion, each first fixing portion is capable of being latched to each first restricting portion for preventing the back panel from disengaging with the lower cover in a direction parallel to the corresponding sidewall.

4. The housing as claimed in claim 2, wherein each first inserting portion extends from each first rim, each first engaging portion protrudes from each sidewall, each first inserting portion is capable of being limited in each first slot for preventing the back panel from disengaging with the lower cover in a direction perpendicular to the corresponding sidewall.

5. The housing as claimed in claim 4, wherein each first slot extends in a direction parallel to each first rim.

6. The housing as claimed in claim 2, wherein each first fixing portion extends from each first rim, each first inserting portion extends from an end of each first fixing portion opposite to the corresponding first rim, each first engaging portion and each first restricting portion protrude from each sidewall and correspond to each first inserting portion and each first fixing portion respectively.

7. The housing as claimed in claim 1, wherein an end of the first restricting portion is cut to form a cutout, the cutout abuts an edge of the first latching hole to prevent the first fixing portion from disengaging with the first restricting portion.

8. The housing as claimed in claim 1, wherein each first fixing portion is made of elastic material.

9. The housing as claimed in claim 2, wherein the housing further comprises a second fixing mechanism, the second fixing mechanism comprises a second fixing portion extending from the first rim and defining a second latching hole, a second inserting portion extending from an end of the second fixing portion opposite to the first rim, a second restricting portion protruding from the bottom plate, and a second engaging portion protruding from the bottom plate and defining a second slot extending in a direction parallel to the second rim, the second inserting portion is capable of being limited to the second slot and the second fixing portion is capable of being latched to each second engaging portion for preventing the back panel from disengaging with the lower cover in a third direction perpendicular to the first and second direction.

10. A housing of an electronic device comprising:
a lower cover comprising a bottom cover and a sidewall extending from an edge of the bottom plate;
a back panel secured to the lower cover;
a first fixing mechanism for securing the back panel to the lower cover, the first fixing mechanism comprises a first fixing portion positioned on the back panel and defining a first latching hole, a first inserting portion positioned on the back panel, a first restricting portion protruding from the sidewall, and a first engaging portion protruding from the sidewall and defining a first slot; and
a second fixing mechanism for securing the back panel to the lower cover, the second fixing mechanism comprises a second fixing portion positioned on the back panel and defining a second latching hole, a second inserting portion positioned on the back panel, a second restricting portion protruding from the bottom cover, and a second engaging portion protruding from the bottom cover and defining a second slot;
wherein the first inserting portion is capable of being limited to the first slot for preventing the back panel from disengaging with the lower cover in a first direction, the first fixing portion is capable of being latched to the first engaging portion for preventing the back panel from disengaging with the lower cover in a second direction perpendicular to the first direction, and the second fixing portion is capable of being latched to the second engaging portion for preventing the back panel from disengaging with the lower cover in a third direction perpendicular to the first and second direction.

11. The housing as claimed in claim 10, wherein the back panel comprises a first rim connected to the sidewall and a second rim connected to the bottom plate.

12. The housing as claimed in claim 11, wherein the first fixing portion extends from the first rim, the first restricting portion protrudes from the sidewall and corresponds to the first fixing portion, the first fixing portion is capable of being latched to the first restricting portion for preventing the back panel from disengaging with the lower cover in a direction parallel to the sidewall.

13. The housing as claimed in claim 11, wherein the first engaging portion protrudes from the sidewall, the first inserting portion extends from the first rim, the first inserting portion is capable of being limited in the first slot for preventing the back panel from disengaging with the lower cover in a direction perpendicular to the sidewall.

14. The housing as claimed in claim 13, wherein the first slot extends in a direction parallel to the first rim.

15. The housing as claimed in claim 11, wherein the first fixing portion extends from the first rim, the first inserting portion extends from an end of the first fixing portion opposite to the corresponding first rim, the first engaging portion and the first restricting portion extend from the sidewall and correspond to the first inserting portion and the first fixing portion respectively.

16. The housing as claimed in claim 10, wherein an end of the first restricting portion is cut to form a cutout, the cutout abuts an edge of the first latching hole to prevent the first fixing portion from disengaging with the first restricting portion.

17. The housing as claimed in claim 10, wherein the first fixing portion is made of elastic material.

18. The housing as claimed in claim 11, wherein the second fixing portion extends from the second rim, the second inserting portion extends from an end of the second fixing portion opposite to the second rim, the second restricting portion and the second engaging portion protrude from the bottom plate; the second inserting portion is capable of being limited to the second slot, and the second fixing portion is capable of being latched to the second engaging portion, for preventing the back panel from disengaging with the lower cover in a direction perpendicular to the bottom plate.

19. The housing as claimed in claim 18, wherein the second slot extends in a direction parallel to the second rim.

20. The housing as claimed in claim 18, wherein the second inserting portion is integrally formed with the fixing portion.

* * * * *